(12) United States Patent
Isoya

(10) Patent No.: US 12,082,371 B2
(45) Date of Patent: Sep. 3, 2024

(54) ELECTRONIC DEVICE

(71) Applicant: NEC Platforms, Ltd., Kawasaki (JP)

(72) Inventor: Satoshi Isoya, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 217 days.

(21) Appl. No.: 17/772,787

(22) PCT Filed: Nov. 2, 2020

(86) PCT No.: PCT/JP2020/041071
§ 371 (c)(1),
(2) Date: Apr. 28, 2022

(87) PCT Pub. No.: WO2021/095587
PCT Pub. Date: May 20, 2021

(65) Prior Publication Data
US 2022/0408595 A1 Dec. 22, 2022

(30) Foreign Application Priority Data
Nov. 13, 2019 (JP) .................................. 2019-205335

(51) Int. Cl.
*H05K 7/20* (2006.01)
(52) U.S. Cl.
CPC ..... *H05K 7/20272* (2013.01); *H05K 7/20145* (2013.01); *H05K 7/20772* (2013.01)
(58) Field of Classification Search
CPC ........... H05K 7/20254; H05K 7/20272; H05K 7/20772; H05K 7/20145; F16L 35/00; F16L 27/127
See application file for complete search history.

(56) References Cited

U.S. PATENT DOCUMENTS

| 7,372,698 | B1 * | 5/2008 | Tilton ............... H05K 7/20772 |
| | | | 361/698 |
| 10,638,645 | B1 * | 4/2020 | Moen ................... G21C 15/182 |
| 2004/0250992 | A1 | 12/2004 | Aoki et al. |

(Continued)

FOREIGN PATENT DOCUMENTS

| EP | 3328172 A1 | 5/2018 |
| JP | 2002-335091 A | 11/2002 |

(Continued)

OTHER PUBLICATIONS

International Search Report for PCT Application No. PCT/JP2020/041071, mailed on Jan. 19, 2021.

(Continued)

*Primary Examiner* — Zachary Pape

(57) ABSTRACT

An electronic device includes a substrate which is provided in a housing and on which a heat generating member is mounted, a cooling member configured to cool the heat generating member, a first tube including one end connected to the cooling member and configured to supply a cooling medium to the cooling member or discharge the cooling medium from the cooling member, a joint member including a first connection portion extending in a tube axial direction of the first tube and connected to another end of the first tube, a support member fixed to the housing or the substrate, and a tube fixing portion configured to fix the first tube to the support member.

8 Claims, 6 Drawing Sheets

(56) References Cited

U.S. PATENT DOCUMENTS

| | | | |
|---|---|---|---|
| 2006/0187638 A1* | 8/2006 | Vinson | H05K 7/20009 |
| | | | 361/698 |
| 2007/0125523 A1* | 6/2007 | Bhatti | H05K 7/20772 |
| | | | 165/80.4 |
| 2010/0226094 A1* | 9/2010 | Attlesey | H05K 7/20772 |
| | | | 361/699 |
| 2010/0254758 A1 | 10/2010 | Campbell et al. | |
| 2013/0105116 A1 | 5/2013 | Campbell et al. | |
| 2013/0277008 A1 | 10/2013 | Ishikura et al. | |
| 2014/0364046 A1* | 12/2014 | Li | H05K 7/20145 |
| | | | 454/324 |
| 2016/0066480 A1 | 3/2016 | Eckberg et al. | |
| 2018/0228058 A1 | 8/2018 | Jiang et al. | |
| 2019/0104646 A1 | 4/2019 | So et al. | |
| 2019/0239386 A1 | 8/2019 | Chen et al. | |
| 2019/0278161 A1 | 9/2019 | Kishimoto et al. | |
| 2021/0195795 A1 | 6/2021 | Ochiai | |

FOREIGN PATENT DOCUMENTS

| | | | | |
|---|---|---|---|---|
| JP | 2010-244546 | A | 10/2010 | |
| JP | 2011-253984 | A | 12/2011 | |
| JP | 2015-501489 | A | 1/2015 | |
| JP | 5793105 | B2 | 10/2015 | |
| JP | 2019-079843 | A | 5/2019 | |
| WO | 2013/063250 | A1 | 5/2013 | |
| WO | 2017/122409 | A1 | 7/2017 | |
| WO | WO-2019077831 | A1 * | 4/2019 | F16L 35/00 |

OTHER PUBLICATIONS

Extended European Search Report for EP Application No. 20887022.0, dated on Nov. 13, 2023.

* cited by examiner

ELECTRONIC DEVICE

This application is a National Stage Entry of PCT/JP2020/041071 filed on Nov. 2, 2020, which claims priority from Japanese Patent Application 2019-205335 filed on Nov. 13, 2019, the contents of all of which are incorporated herein by reference, in their entirety.

TECHNICAL FIELD

The present invention relates to an electronic device.

BACKGROUND ART

Various electronic devices house a plurality of electronic components in a housing. A liquid cooling scheme is adopted in which the electronic components having high heat generation among the plurality of electronic components housed in the housing are cooled by a liquid cooling medium.

For example, Patent Document 1 discloses a configuration including a liquid-cooled structure (cooling member) for cooling a heat generating component (heat generating member) of an electronic subsystem (module) provided in a housing.

PRIOR ART DOCUMENT

Patent Document

Patent Document 1: Published Japanese Translation No. 2015-501489 of the PCT International Publication

SUMMARY

Problems to be Solved by the Invention

A tube for supplying and discharging the cooling medium is connected to the cooling member disclosed in Patent Document 1.

For example, when performing maintenance or the like and a joint provided at one end of the tube is attached to or detached from another tube, a force acts on the tube.

However, when the tube is connected to the cooling member as disclosed in Patent Document 1, a load may be applied to a connection portion between the other end of the tube and the cooling member and a fixing portion of the cooling member on a housing side.

An example object of the present invention is to provide an electronic device that solve any of the above-described problems.

Means for Solving the Problems

An electronic device according to a first example aspect of the present invention is provided with a substrate which is provided in a housing and on which a heat generating member is mounted, a cooling member configured to cool the heat generating member, a first tube including one end connected to the cooling member and configured to supply a cooling medium to the cooling member or discharge the cooling medium from the cooling member, a joint member including a first connection portion extending in a tube axial direction of the first tube and connected to another end of the first tube, a support member fixed to the housing or the substrate, and a tube fixing portion configured to fix the first tube to the support member.

Example Advantageous Effects of Invention

According to the above example aspect, it is possible to prevent a load due to the force acting on the tube from being applied to the connection portion between the tube and the cooling member and the fixing portion of the cooling member on the housing side.

EXAMPLE EMBODIMENT

A plurality of example embodiments of the present invention will be described below with reference to the drawings.

First Example Embodiment

Figure 1:
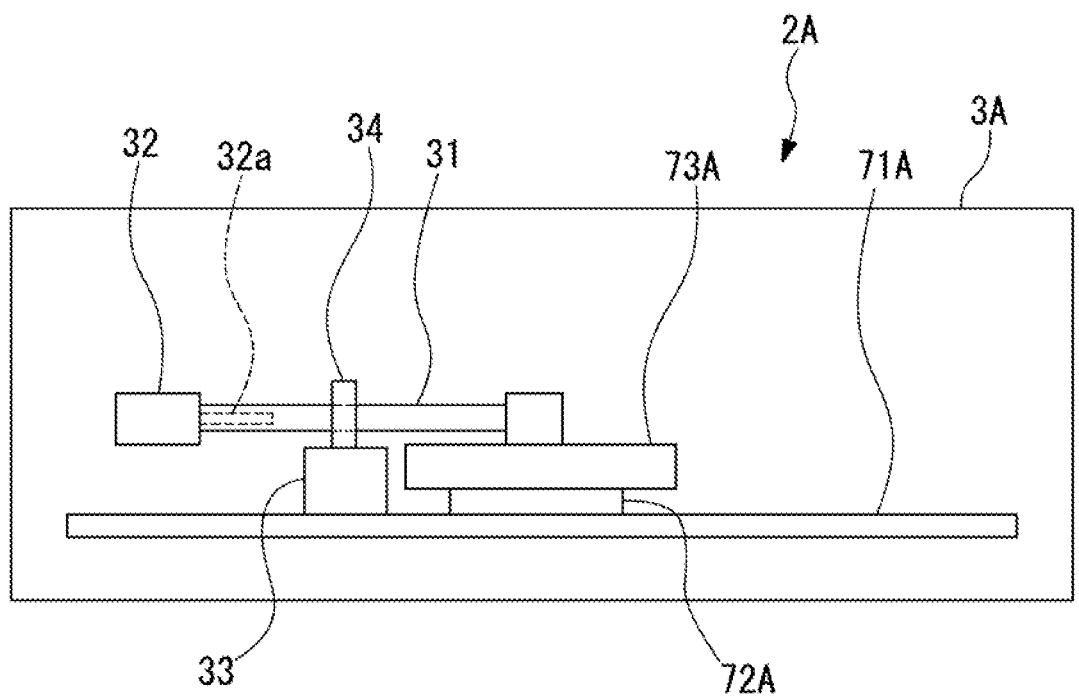
FIG. 1 is a diagram showing a minimum configuration of an electronic device according to a first example embodiment of the present invention.

FIG. 1 is a diagram showing a minimum configuration of an electronic device according to the present example embodiment.

As shown in this figure, an electronic device 2A needs only to be provided with at least a substrate 71A, a cooling member 73A, a first tube 31, a joint member 32, a support member 33, and a tube fixing portion 34.

The substrate 71A is provided in a housing 3A. A heat generating member 72A is mounted on the substrate 71A.

The cooling member 73A cools the heat generating member 72A.

One end of the first tube 31 is connected to the cooling member 73A. The first tube 31 supplies a cooling medium to the cooling member 73A or discharges the cooling medium from the cooling member 73A.

The joint member 32 includes a first connection portion 32a. The first connection portion 32a extends in the tube axial direction of the first tube 31 and is connected to the other end of the first tube 31.

The support member 33 is fixed to the housing 3A or the substrate 71A. In the present example embodiment, the support member 33 is fixed to the substrate 71A. The support member 33 may be fixed to the housing 3A.

The tube fixing portion 34 fixes the first tube 31 to the support member 33.

In such an electronic device 2A, the first tube 31 having one end connected to the cooling member 73A is fixed to the support member 33 by the tube fixing portion 34.

In this configuration, when the joint member 32 in which the first connection portion 32a is connected to the other end of the first tube 31 is attached to or detached from another tube or the like, it is possible to prevent the force acting on the first tube 31 from the joint member 32 side from being transmitted to one end side of the first tube 31.

Therefore, in the electronic device 2A, it is possible to prevent a load due to the force acting on the first tube 31 from being applied to the connection portion between the first tube 31 and the cooling member 73A and the fixing portion of the cooling member 73A on the housing 3A side.

Second Example Embodiment

Figure 2:
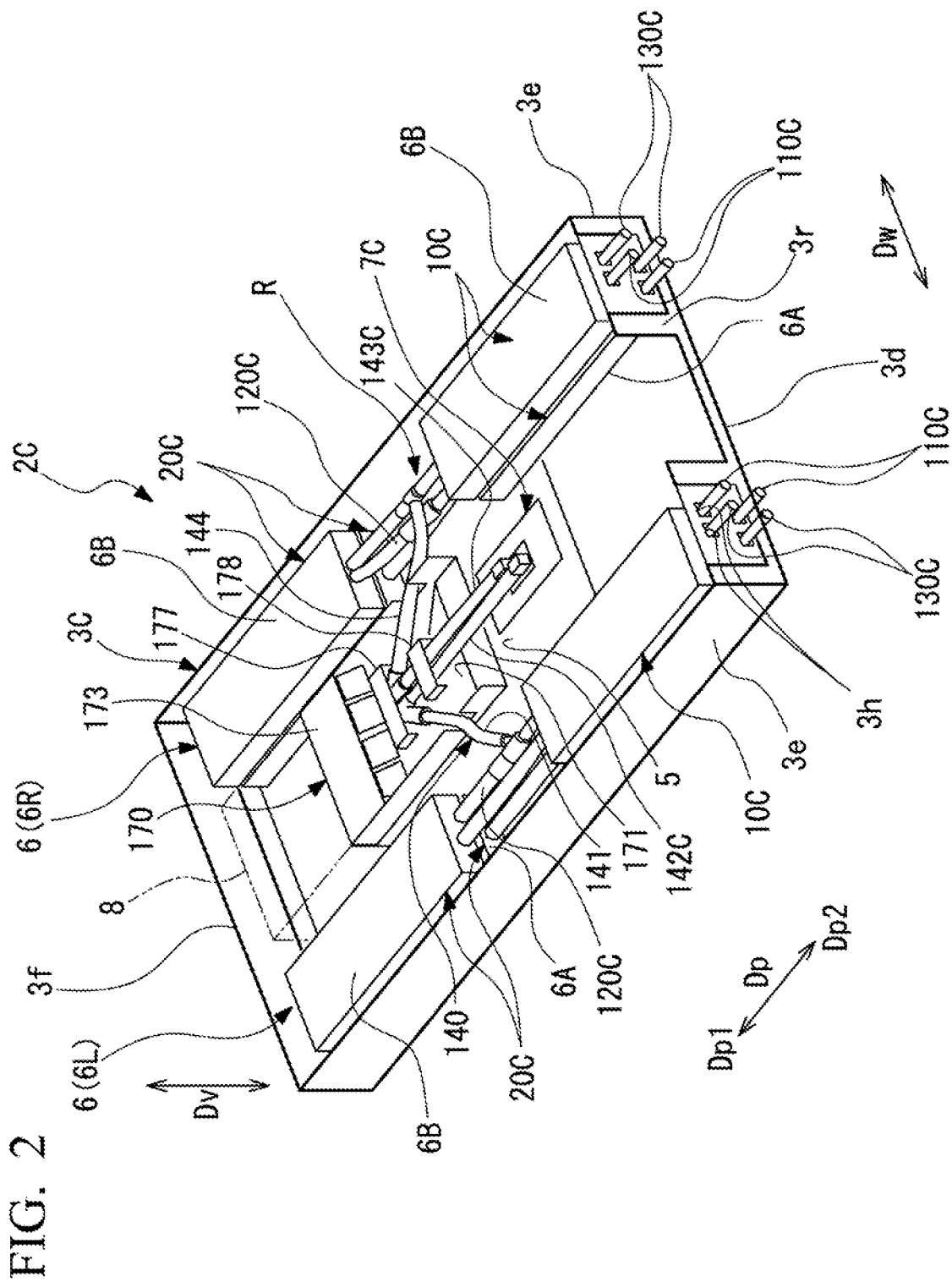
FIG. 2 is a perspective view showing a schematic configuration of an electronic device according to a second example embodiment of the present invention.

FIG. 2 is a perspective view showing a schematic configuration of an electronic device according to the present example embodiment.

(Overall Configuration of Server)

As shown in this figure, a server (electronic device) 2C is provided with a housing 3C, a lower substrate 5, side modules 6, and a center module 7C. One or more servers 2C are housed in a server rack (not shown) to form a server apparatus (not shown). The server 2C is provided so as to be inserted and removed from the server rack (not shown) along the horizontal direction. In the following description, the insertion and removal direction of the server 2C with respect to the server rack is referred to as a depth direction Dp. In addition, the direction orthogonal to the depth direction Dp in the horizontal plane is referred to as a width direction Dw, and the direction orthogonal to the depth direction Dp and the width direction Dw is referred to as a vertical direction Dv.

(Housing)

The housing 3C is formed in a rectangular shape having a long side in the depth direction Dp when viewed from the vertical direction Dv in a plan view. The housing 3C is provided with at least a bottom plate 3d provided along a horizontal plane and a pair of side plates 3e rising upward from both sides of the bottom plate 3d in the width direction Dw. The housing 3C is provided with a rear panel 3r rising upward from the bottom plate 3d on the second side Dp2 of the bottom plate 3d in the depth direction Dp. Furthermore, the housing 3C may be provided with a front panel 3f on the first side Dp1 of the bottom plate 3d in the depth direction Dp.

(Lower Substrate)

The lower substrate 5, the side modules 6, and the center module 7C are housed in the housing 3C.

The lower substrate 5 has a flat plate shape and is disposed along the bottom plate 3d of the housing 3C. The lower substrate 5 is disposed at a central portion in the housing 3C in the width direction Dw.

(Side Module)

The side modules 6 are disposed on both sides of the lower substrate 5 in the width direction Dw in the housing 3C. In each side module 6, a lower stage side module portion 6A and an upper stage side module portion 6B are provided so as to be laminated in the vertical direction Dv. Each of the lower stage side module portion 6A and the upper stage side module portion 6B is provided with a first module 10C and a second module (electronic component module) 20C.

Figure 3:
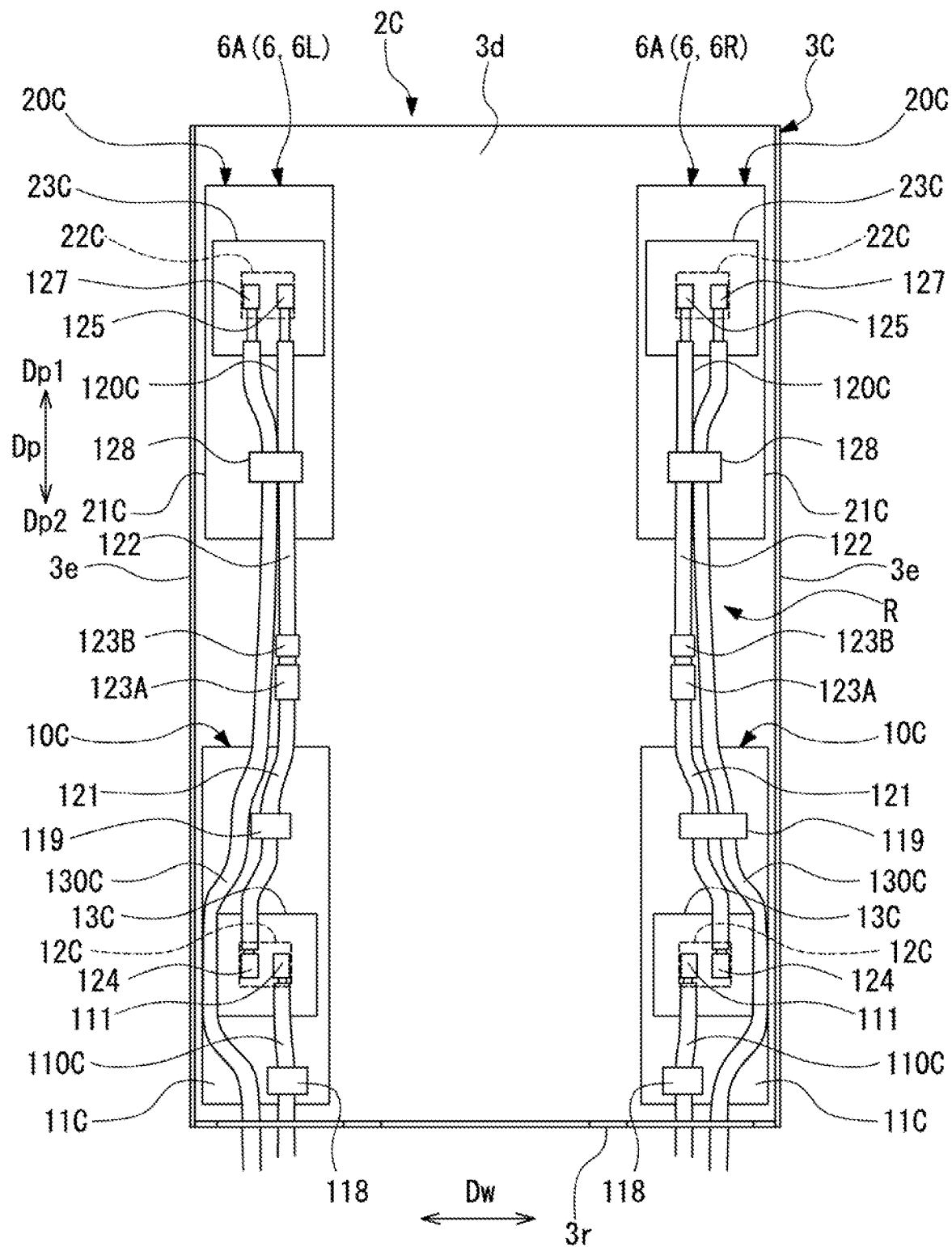
FIG. 3 is a plan view showing side modules on a lower stage side in the electronic device according to the second example embodiment of the present invention.
Figure 4:
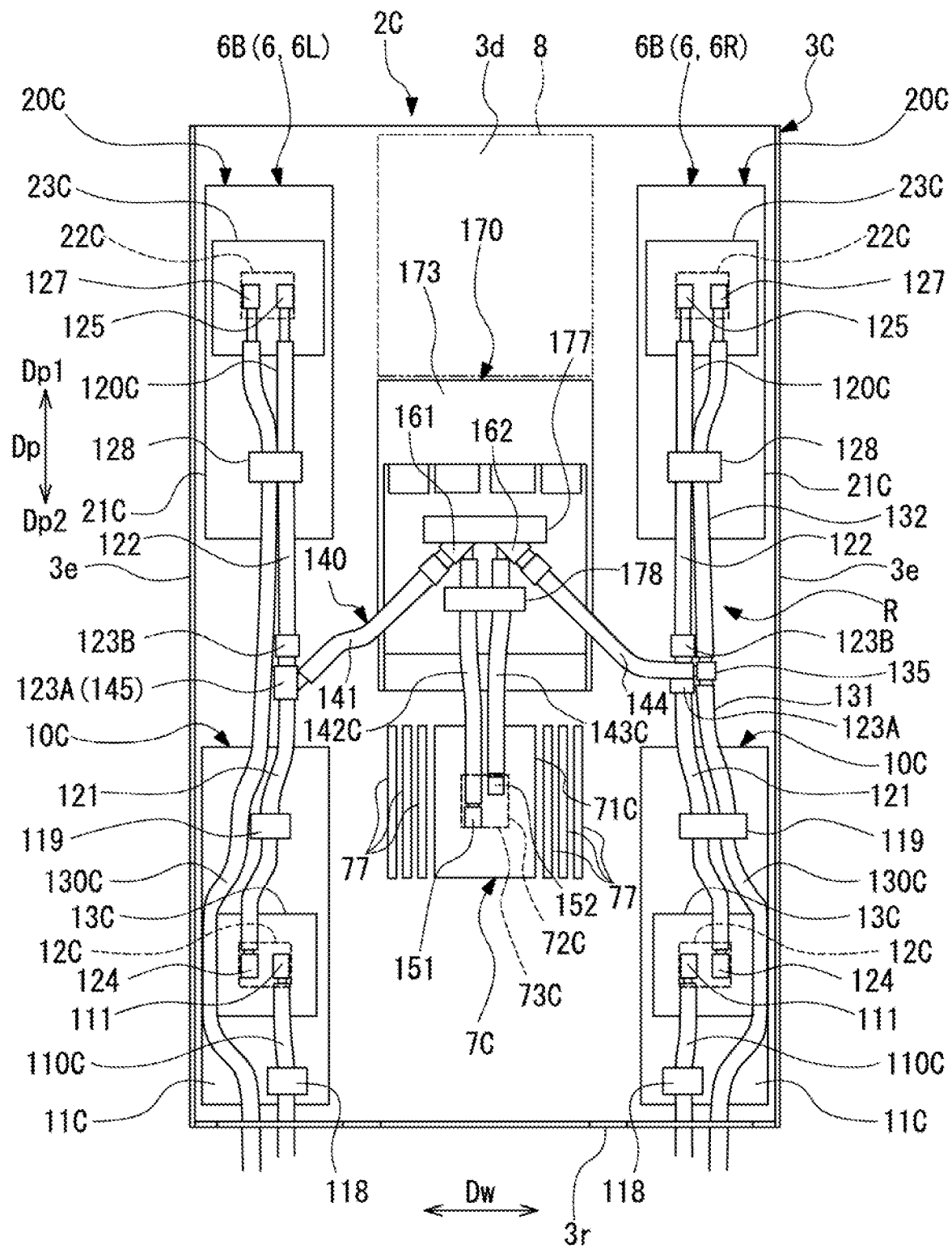
FIG. 4 is a plan view showing side modules on an upper stage side and a center module in the electronic device according to the second example embodiment of the present invention.

FIG. 3 is a plan view showing side modules on a lower stage side in the electronic device according to the present example embodiment. FIG. 4 is a plan view showing side modules on an upper stage side and a center module in the electronic device according to the present example embodiment.

As shown in these figures, the first module 10C is provided in the housing 3C in each of the lower stage side module portion 6A and the upper stage side module portion 6B. The first module 10C is provided with a side module substrate 11C, a side module central processing unit (CPU) 12C, and a side module cooling member 13C.

The side module substrate 11C has a flat plate shape and is disposed along a horizontal plane. The side module CPU 12C is mounted on the surface of the side module substrate 11C. The side module CPU 12C functions as a processor that executes predetermined processing. The side module cooling member 13C is provided so as to be laminated on the side module CPU 12C. The side module cooling member 13C is made of a metal material and has, for example, a rectangular parallelepiped shape. A space (not shown) into which the cooling medium flows is formed inside the side module cooling member 13C. A refrigerant inlet (not shown) and a refrigerant outlet (not shown) communicating with the space (not shown) are formed on the upper surface of the side module cooling member 13C.

The second module 20C is provided in the housing 3C at an interval from the first module 10C on the first side Dp1 of the housing 3C in the depth direction Dp. The second module 20C has the same configuration as the first module 10C and is provided with a side module substrate 21C, a side module CPU 22C, and a side module cooling member 23C.

The side module substrate 21C has a flat plate shape and is disposed along a horizontal plane. The side module CPU 22C is mounted on the surface of the side module substrate 21C. The side module CPU 22C functions as a processor that executes predetermined processing. The side module cooling member 23C is provided so as to be laminated on the side module CPU 22C. The side module cooling member 23C is made of a metal material and has, for example, a rectangular parallelepiped shape. A space (not shown) into which the cooling medium flows is formed inside the side module cooling member 23C. A refrigerant inlet (not shown) and a refrigerant outlet (not shown) communicating with the space (not shown) are formed on the upper surface of the side module cooling member 23C.

(Center Module)

Figure 5:
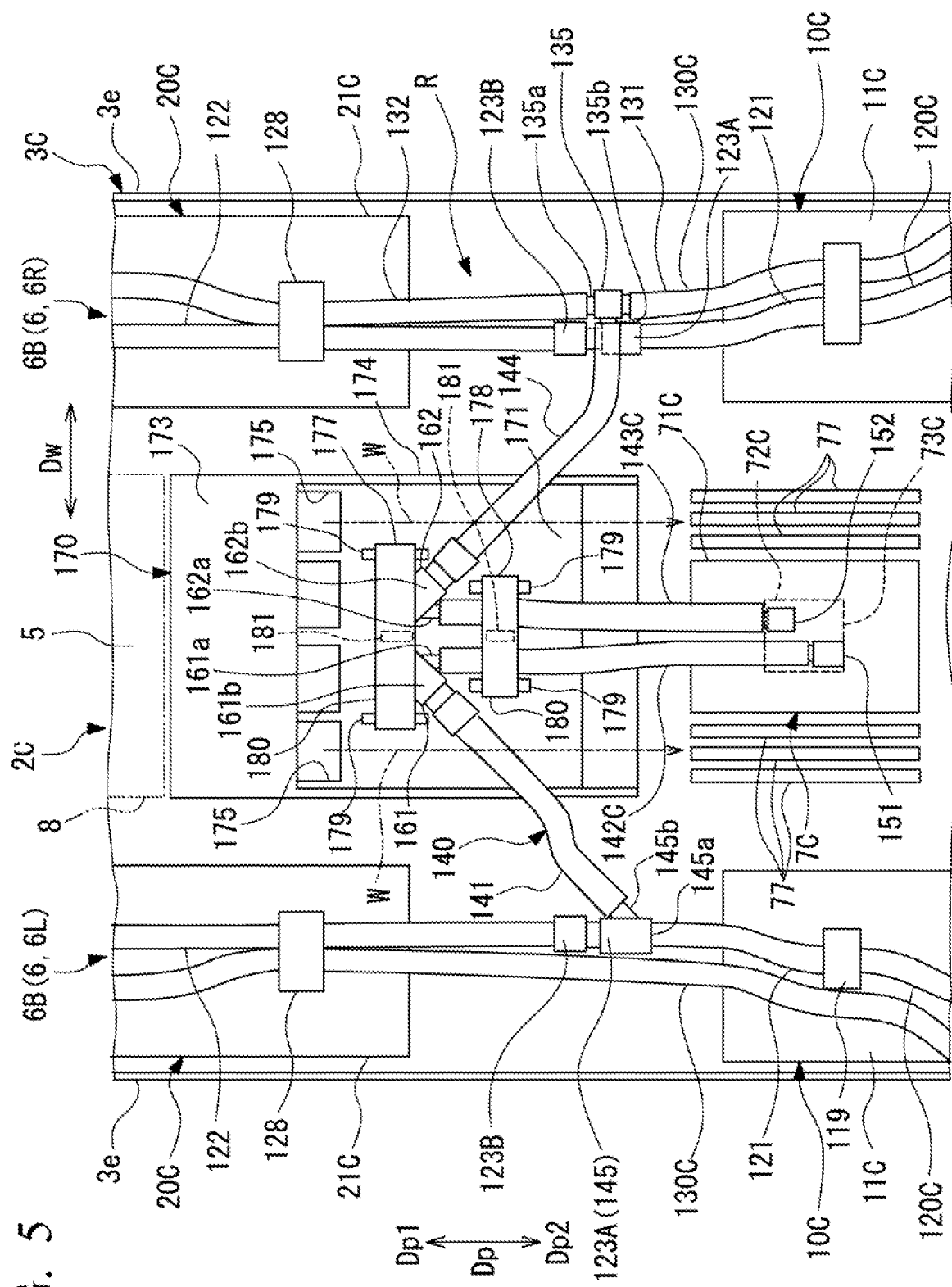
FIG. 5 is a plan view mainly showing a branch tube portion provided in the side modules on the upper stage side and the center module in the electronic device according to the second example embodiment of the present invention.

FIG. 5 is a plan view mainly showing a branch tube portion provided in the side modules on the upper stage side and the center module in the electronic device according to the present example embodiment.

As shown in FIG. 2, the center module 7C is disposed above the lower substrate 5 at an interval from each side module 6 in the width direction Dw. The center module 7C is disposed at substantially the same height as the upper stage side module portions 6B in the vertical direction Dv. As shown in FIGS. 4 and 5, the center module 7C is provided with a substrate 71C, a CPU (heat generating member) 72C, a cooling member 73C, and electronic components (components) 77.

The substrate 71C has a flat plate shape and is disposed along a horizontal plane in parallel with the bottom plate 3d of the housing 3C. The substrate 71C has a rectangular shape when viewed from the vertical direction Dv in a plan view. The substrate 71C is supported on the lower substrate 5 or the bottom plate 3d via a support member (not shown).

The CPU 72C is mounted on the substrate 71C. The CPU 72C functions as a processor that executes predetermined processing in cooperation with the side module CPUs 12C and 22C of the plurality of first modules 10C and the the plurality of second modules 20C.

The cooling member 73C is provided so as to be laminated on the CPU 72C. The cooling member 73C cools the CPU 72C mounted on the substrate 71C. The cooling member 73C is made of a metal material and has, for example, a rectangular parallelepiped shape. A space (not shown) for a cooling medium for cooling the CPU 72C is formed inside the cooling member 73C.

The electronic components 77 are provided on the substrate 71C on both sides of the CPU 72C and the cooling member 73C in the width direction Dw. The electronic component 77 is, for example, a plate-shaped memory and is mounted on the substrate 71C. The electronic component 77 is disposed along a plane orthogonal to the width direction Dw. The plurality of electronic components 77 are provided at intervals in the width direction Dw.

(Cooling System)

As shown in FIGS. 2 to 4, the server 2C is provided with a cooling system R. The cooling system R forms a flow path of a cooling medium for cooling the side module cooling members 13C of the first modules 10C, the side module cooling members 23C of the second modules 20C, and the cooling member 73C of the center module 7C. The cooling system R is provided with upstream side tubes 110C, downstream side tubes (third tube) 120C, discharge tubes (third tube) 130C, and a branch tube portion 140.

(Upstream Side Tube and Downstream Side Tube)

The upstream side tube 110C supplies a cooling medium made of a liquid such as water to the side module cooling member 13C of the first module 10C from the outside. The upstream side tube 110C is inserted from the outside to the inside of the housing 3C through a tube insertion opening 3h (refer to FIG. 2) formed in the rear panel 3r of the housing 3C. As shown in FIGS. 3 and 4, the upstream side tube 110C extends in the depth direction Dp in the housing 3C. The upstream side tube 110C is connected to the side module cooling member 13C of the first module 10C from the second side Dp2 in the depth direction Dp. An end portion of the upstream side tube 110C is connected to the refrigerant inlet (not shown) of the side module cooling member 13C of the first module 10C via an L-shaped connection joint 111. The upstream side tube 110C is fixed to the side module substrate 11C of the first module 10C by a holder member 118 between the connection joint 111 and the portion inserted into the tube insertion opening 3h.

The downstream side tube 120C supplies the cooling medium passed through the side module cooling member 13C of the first module 10C to the side module cooling member 23C of the second module 20C. The downstream side tube 120C is provided so as to extend in the depth direction Dp between the side module cooling member 13C of the first module 10C and the side module cooling member 23C of the second module 20C. One end of the downstream side tube 120C is connected to the side module cooling member 13C of the first module 10C, and the other end of the downstream side tube 120C is connected to the side module cooling member 23C of the second module 20C. The downstream side tube 120C is provided with a first downstream side tube 121, a second downstream side tube 122, and joints 123A and 123B.

One end portion of the first downstream side tube 121 is connected to a refrigerant outlet (not shown) of the side module cooling member 13C of the first module 10C via an L-shaped connection joint 124. The connection joint 124 is connected to the side module cooling member 13C at a position spaced apart from the connection joint 111 of the upstream side tube 110C in the width direction Dw. The joint 123A is provided at the other end portion of the first downstream side tube 121. The first downstream side tube 121 is fixed to the side module substrate 11C of the first module 10C by a holder member 119 between the connection joint 124 and the joint 123A.

One end portion of the second downstream side tube 122 is connected to the refrigerant inlet (not shown) of the side module cooling member 23C of the second module 20C via an L-shaped connection joint 125. A joint 123B is provided at the other end portion of the second downstream side tube 122. The second downstream side tube 122 is fixed to the side module substrate 21C of the second module 20C by a holder member 128 between the connection joint 125 and the joint 123B.

The joints 123A and 123B are detachably connected to each other. As a result, the joints 123A and 123B detachably connect the first downstream side tube 121 and the second downstream side tube 122.

(Discharge Tube)

The discharge tube 130C discharges the cooling medium from the second module 20C. The discharge tube 130C discharges the cooling medium passed through the first module 10C and the second module 20C. The discharge tube 130C is inserted into the housing 3C from the outside of the housing 3C through the tube insertion opening 3h formed in the rear panel 3r of the housing 3C. The discharge tube 130C extends in the depth direction Dp in the housing 3C. The discharge tube 130C is connected to the side module cooling member 23C of the second module 20C from the second side Dp2 in the depth direction Dp. The end portion of the discharge tube 130C is connected to the refrigerant outlet (not shown) of the side module cooling member 23C of the second module 20C via an L-shaped connection joint 127. The connection joint 127 is connected to the side module cooling member 23C at a position spaced apart from the connection joint 125 of the second downstream side tube 122 in the width direction Dw. The discharge tube 130C is fixed to the side module substrate 21C of the second module 20C by the holder member 128 together with the second downstream side tube 122 on the first module 10C side with respect to the connection joint 127.

(Branch Tube Portion and Cooling System)

The branch tube portion 140 takes out part of the cooling medium from the upper stage side module portion 6B of the side module 6L on one side in the width direction Dw (e.g., left side in FIGS. 4 and 5) in the housing 3C, and supplies the part of the cooling medium that has been taken out to the cooling member 73C of the center module 7C. The branch tube portion 140 sends the cooling medium passed through the cooling member 73C to the upper stage side module portion 6B of the side module 6R on the other side in the width direction Dw (e.g., right side in FIGS. 4 and 5) in the housing 3C. The branch tube portion 140 is provided with a supply side second tube (second tube) 141, a supply side first tube (first tube) 142C, a discharge side first tube (first tube) 143C, and a discharge side second tube (second tube) 144.

The supply side second tube 141 is connected to the downstream side tube 120C that supplies the cooling medium to the second module 20C provided at a position different from that of the substrate 71C in the housing 3C. The supply side second tube 141 is made of a flexible tube having flexibility and is provided so as to branch from the downstream side tube 120C. Therefore, a branch joint 145 is used for the joint 123A on the first downstream side tube 121 side. As shown in FIG. 5, the branch joint 145 includes a main tube portion 145a and a branch tube portion 145b. The main tube portion 145a has a tubular shape continuous in the depth direction Dp and is detachably connected to the joint 123B. The branch tube portion 145b branches from the main tube portion 145a and diagonally extends inward in the width direction Dw of the housing 3C toward the first side Dp1 in the depth direction Dp. One end portion of the supply side second tube 141 is connected to the branch tube portion 145b. The supply side second tube 141 extends diagonally from the branch joint 145 to the first side Dp1 in the depth direction Dp inward in the width direction Dw of the housing 3C.

The supply side first tube 142C supplies the cooling medium to the space (not shown) of the cooling member 73C. The supply side first tube 142C is made of a flexible tube having flexibility and extends along the surface of the substrate 71C in the depth direction Dp. One end of the supply side first tube 142C is connected to the refrigerant inlet (not shown) of the cooling member 73C of the center module 7C via an L-shaped connection joint 151.

The supply side second tube 141 and the supply side first tube 142C extending in different directions from each other are connected to each other via a joint member 161. The supply side second tube 141, the joint member 161, and the supply side first tube 142C are provided so as to bypass the electronic components 77 on one side (left side in FIG. 5) in the width direction Dw mounted on the substrate 71C.

The joint member 161 is made of metal and has a V shape when viewed from the vertical direction Dv in a plan view. The joint member 161 integrally includes a first connection portion 161a and a second connection portion 161b.

The first connection portion 161a has a tubular shape and extends in the tube axial direction (depth direction Dp) of the supply side first tube 142C. The other end of the supply side first tube 142C is connected to the first connection portion 161a. The second connection portion 161b has a tubular shape and extends in the tube axial direction (diagonal direction intersecting the width direction Dw and the depth direction Dp) of the supply side second tube 141. The other end portion of the supply side second tube 141 is connected to the second connection portion 161b. The first connection portion 161a and the second connection portion 161b communicate with each other.

The discharge side first tube 143C discharges the cooling medium from the space (not shown) of the cooling member 73C. The discharge side first tube 143C is made of a flexible tube having flexibility and extends along the surface of the substrate 71C in the depth direction Dp. One end of the discharge side first tube 143C is connected to the refrigerant outlet (not shown) of the cooling member 73C via an L-shaped connection joint 152. In the present example embodiment, the connection joint 152 is connected to the cooling member 73C at a different position in the width direction Dw and the depth direction Dp with respect to the connection joint 151.

The discharge side second tube 144 is made of a flexible tube having flexibility and extends diagonally on the second side Dp2 in the depth direction Dp toward the outside of the housing 3C in the width direction Dw. The discharge side first tube 143C and the discharge side second tube 144 extending in different directions from each other are connected to each other via a joint member 162. The discharge side first tube 143C, the joint member 162, and the discharge side second tube 144 are provided so as to bypass the electronic components 77 on the other side (right side in FIG. 5) in the width direction Dw mounted on the substrate 71C.

The joint member 162 is made of metal and has a V shape when viewed from the vertical direction Dv in a plan view. The joint member 162 integrally includes a first connection portion 162a and a second connection portion 162b. The first connection portion 162a has a tubular shape and extends in the tube axial direction (depth direction Dp) of the discharge side first tube 143C. The other end of the discharge side first tube 143C is connected to the first connection portion 162a. The second connection portion 162b has a tubular shape and extends in the tube axial direction (diagonal direction intersecting the width direction Dw and the depth direction Dp) of the discharge side second tube 144. One end portion of the discharge side second tube 144 is connected to the second connection portion 162b. The first connection portion 162a and the second connection portion 162b communicate with each other. Such a joint member 162 has the same configuration as the joint member 161 and is configured to include common components.

The other end of the discharge side second tube 144 is connected to the discharge tube 130C provided in the upper stage side module portion 6B of the side module 6R on the other side in the width direction Dw via a merging joint 135. As a result, the discharge side second tube 144 is connected to the discharge tube 130C that discharges the cooling medium from the second module 20C provided at a position different from that of the substrate 71C in the housing 3C. The discharge tube 130C provided in the upper stage side module portion 6B of the side module 6R is provided with a first discharge tube 131 on the first module 10C side and a second discharge tube 132 on the second module 20C side. The merging joint 135 is provided between an end portion of the first discharge tube 131 and an end portion of the second discharge tube 132.

The merging joint 135 includes a main tube portion 135a and a branch tube portion 135b. The main tube portion 135a has a tubular shape continuous in the depth direction Dp, and both end portions thereof are connected to the first discharge tube 131 and the second discharge tube 132. The branch tube portion 135b branches from the main tube portion 135a at the intermediate portion of the main tube portion 135a and extends inward in the width direction Dw of the housing 3C. The other end of the discharge side second tube 144 is connected to the branch tube portion 135b.

(Flow of Cooling Medium)

In such a cooling system R, the cooling medium flows in each of the lower stage side module portions 6A and the upper stage side module portions 6B of the side modules 6 (6L, 6R) on both sides in the width direction Dw as follows.

The cooling medium flows into the upstream side tube 110C from a cooling medium supply tube (not shown) provided outside the housing 3C. The cooling medium flows into the space (not shown) from the refrigerant inlet (not shown) of the side module cooling member 13C of the first module 10C through the upstream side tube 110C and cools the side module cooling member 13C. As a result, the heat of the side module CPU 12C on which the side module cooling member 13C is laminated is taken away, and the temperature rise of the side module CPU 12C is suppressed. The cooling medium that flows out from the space (not shown) of the side module cooling member 13C through the refrigerant outlet (not shown) flows into the space (not shown) from the refrigerant inlet (not shown) of the side module cooling member 23C of the second module 20C via the downstream side tube 120C and cools the side module cooling member 23C. As a result, the heat of the side module CPU 22C of the second module 20C on which the side module cooling member 23C is laminated is taken away, and the temperature rise of the side module CPU 22C is suppressed. The cooling medium passed through the first module 10C and the second module 20C in this manner flows from the space (not shown) of the side module cooling member 23C through the refrigerant outlet (not shown) into the discharge tube 130C. The cooling medium is discharged to a cooling medium discharge tube (not shown) provided outside the housing 3C through the discharge tube 130C.

In addition, in the upper stage side module portion 6B of the side module 6L on one side in the width direction Dw, part of the cooling medium flowed into the first downstream side tube 121 of the downstream side tube 120C via the side module cooling member 13C of the first module 10C is diverted to the branch tube portion 140 through the branch joint 145. In the branch joint 145, the cooling medium flowing through the first downstream side tube 121 is divided to the main tube portion 145a and the branch tube portion 145b. The cooling medium flowed into the branch tube portion 145b flows into the space (not shown) of the cooling member 73C from the connection joint 151 through the supply side second tube 141, the joint member 161, and the supply side first tube 142C. The cooling member 73C is cooled by the cooling medium flowed into the space (not shown). As a result, the heat of the CPU 72C mounted on the substrate 71C is taken away, and the temperature rise of the CPU 72C is suppressed. The cooling medium in the space (not shown) flows out to the discharge side first tube 143C via the connection joint 152 connected to the other end portion of the space (not shown). The cooling medium flows into the branch tube portion 135b of the merging joint 135 through the discharge side first tube 143C, the joint member 162, and the discharge side second tube 144. The cooling medium merges with the flow of the cooling medium in the main tube portion 135a from the branch tube portion 135b and flows into the first discharge tube 131 of the discharge tube 130C. The cooling medium is discharged to the cooling medium discharge tube (not shown) provided outside the housing 3C through the discharge tube 130C provided in the upper stage side module portion 6B of the side module 6R on the other side in the width direction Dw.

(Support Member)

Figure 6:
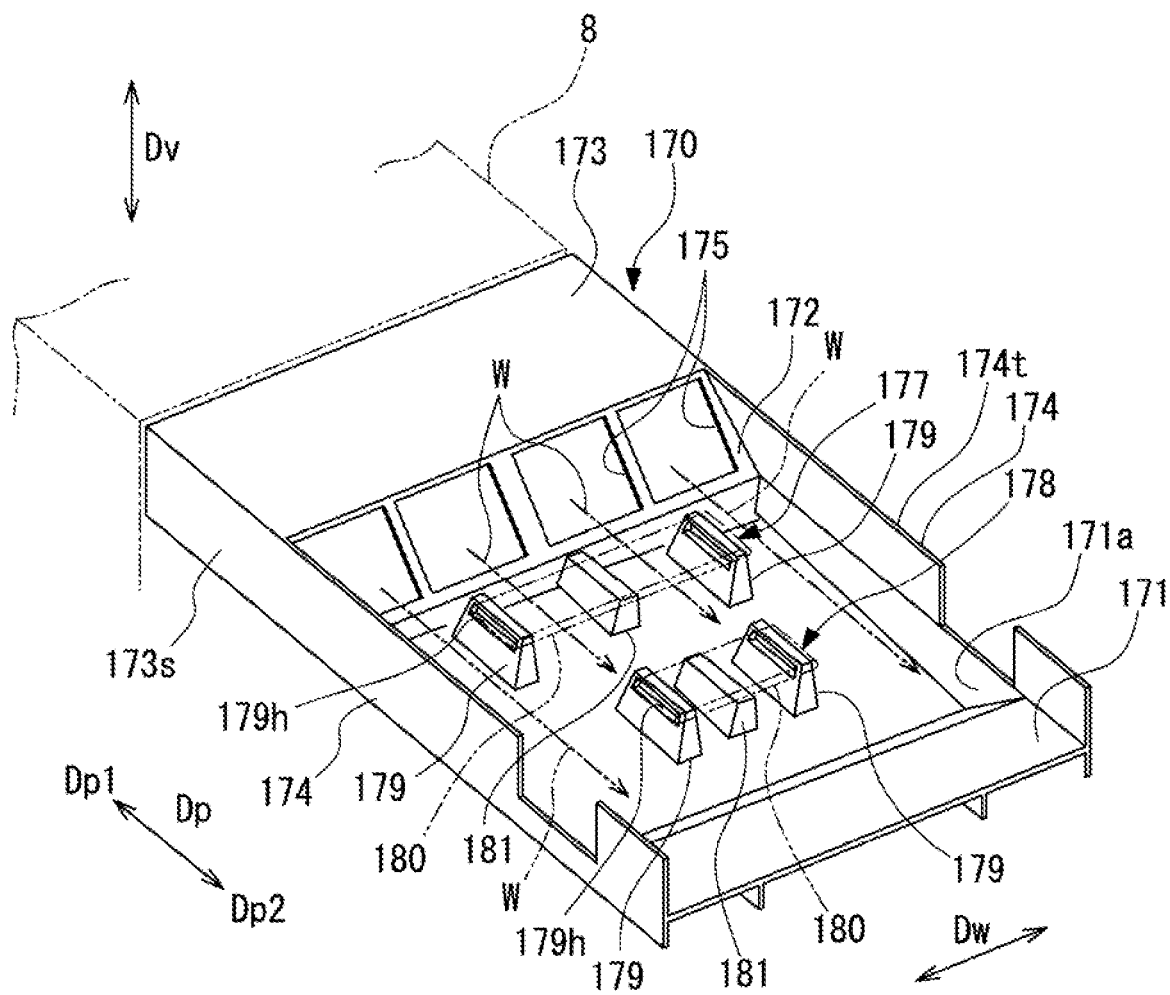
FIG. 6 is a perspective view showing a support member provided in the electronic device according to the second example embodiment of the present invention.

FIG. 6 is a perspective view showing a support member provided in the electronic device of the present example embodiment.

A support member 170 is provided in the housing 3C. The support member 170 is made of a material having electrical insulation such as resin. The support member 170 is fixed to the housing 3C or the lower substrate 5 by being supported by a stay (not shown), other components, or the like. As shown in FIGS. 5 and 6, the support member 170 is provided with a plate portion 171, a hood portion 173, guide walls 174, ventilation portions 175, a joint fixing portion 177, and a tube fixing portion 178.

The plate portion 171 has a rectangular shape in a plan view and is provided along the horizontal plane so as to intersect the vertical direction Dv. The plate portion 171 is provided above the lower substrate 5 at intervals. A recessed portion 171a that is recessed downward is formed in the plate portion 171. The recessed portion 171a is formed so as to be gradually inclined downward from the outer peripheral portion toward the inner peripheral portion of the plate portion 171.

The hood portion 173 is provided on the first side Dp1 in the depth direction Dp with respect to the plate portion 171. The hood portion 173 has a rectangular shape in a plan view and is provided along the horizontal plane so as to intersect the vertical direction Dv. The hood portion 173 is disposed at a position higher than the plate portion 171 in the vertical direction Dv. Side wall portions 173s extending downward are formed on both sides of the hood portion 173 in the width direction Dw.

An inclined surface 172 extending diagonally downward from the hood portion 173 toward the second side Dp2 in the depth direction Dp is formed between the hood portion 173 and the plate portion 171.

The guide walls 174 are formed so as to extend upward from both sides of the plate portion 171 in the width direction Dw. An upper end 174t of the guide wall 174 is disposed at the same height as the upper surface of the hood portion 173 in the vertical direction Dv. The guide wall 174 extends continuously from the hood portion 173 to the second side Dp2 in the depth direction Dp.

The ventilation portions 175 are formed on the inclined surface 172. The ventilation portions 175 are a plurality of openings that penetrate the inclined surface 172 in the depth direction Dp (plate thickness direction).

The joint fixing portion 177 and the tube fixing portion 178 are formed on the plate portion 171. The joint fixing portion 177 and the tube fixing portion 178 each are provided with a pair of locking portions 179 provided at intervals in the width direction Dw, and a fixing member 180. Each locking portion 179 projects upward from the plate portion 171. A through-hole 179h penetrating in the width direction Dw is formed in each locking portion 179. The fixing member 180 is made of, for example, a strip-shaped belt material. The fixing member 180 is inserted into the through-holes 179h of the pair of locking portions 179 and is formed in an annular shape by a hook-and-loop fastener, other buckles, or the like. The fixing member 180 is bridged between the pair of locking portions 179.

The joint fixing portion 177 and the tube fixing portion 178 are each provided with a partition member 181 between the pair of locking portions 179. The partition member 181 projects upward from the plate portion 171. In the joint fixing portion 177, the partition member 181 is interposed between the joint members 161 and 162. In the tube fixing portion 178, the partition member 181 is interposed between the supply side first tube 142C and the discharge side first tube 143C.

The above joint member 161 and the joint member 162 are fixed by the joint fixing portion 177 by being interposed between the plate portion 171 and the fixing member 180 in the vertical direction Dv. In addition, the supply side first tube 142C and the discharge side first tube 143C are fixed to the tube fixing portion 178 by being interposed between the plate portion 171 and the tube fixing portion 178.

At this time, the joint members 161 and 162, the supply side first tube 142C, and the discharge side first tube 143C are each interposed between the plate portion 171 and the fixing member 180, so that the movement in the vertical direction Dv is restricted.

In addition, the joint members 161 and 162, the supply side first tube 142C, and the discharge side first tube 143C are each interposed between the locking portions 179 and the partition member 181, so that the movement in the width direction Dw is restricted.

Furthermore, the joint members 161 and 162, the supply side first tube 142C, and the discharge side first tube 143C are each interposed between the plate portion 171 and the fixing members 180, so that the movement in the depth direction Dp is restricted.

The substrate 71C and the joint members 161 and 162 are separated from each other by such a plate portion 171 of the support member 170 in the vertical direction Dv.

A cooling fan 8 is provided inside the housing 3C on the first side Dp1 in the depth direction Dp with respect to the hood portion 173. The cooling fan 8 has an air outlet (not shown) under the hood portion 173. The cooling fan 8 takes in air from the outside of the housing 3C and sends cooling air (wind) W in the housing 3C from the first side Dp1 side to the second side Dp2 side in the depth direction Dp. The cooling air W from the cooling fan 8 passes under the hood portion 173.

Part of the cooling air W passing under the hood portion 173 flows out above the plate portion 171 through the ventilation portions 175. The cooling air W flows to the second side Dp2 in the depth direction Dp above the plate portion 171 to cool the electronic components 77 provided in the center module 7C.

In addition, the remaining portion of the cooling air W passing under the hood portion 173 flows under the plate portion 171 to the second side Dp2 in the depth direction Dp. As a result, various electronic components (not shown) mounted on the lower substrate 5 are cooled.

In such a server 2C, the supply side first tube 142C and the discharge side first tube 143C having one end connected to the cooling member 73C are fixed to the support member 170 fixed to the housing 3C or the substrate 71C by the tube fixing portion 178.

In this configuration, when the joint members 161 and 162 are attached to and detached from the supply side second tube 141 and the discharge side second tube 144, a force acts on the supply side first tube 142C and the discharge side first tube 143C.

At that time, the supply side first tube 142C and the discharge side first tube 143C are fixed to the tube fixing portion 178, and thus it is possible to suppress the acting force from being transmitted to one end side of the supply side first tube 142C and the discharge side first tube 143C.

Therefore, in the server 2C, it is possible to prevent a load due to the force acting on the supply side first tube 142C and the discharge side first tube 143C from being applied to the connection portion between the supply side first tube 142C, the discharge side first tube 143C (tube), and the cooling member 73C, or to the fixing portion of the cooling member 73C on the housing 3C side.

In such a server 2C, the joint members 161 and 162 are fixed to the support member 170 fixed to the housing 3C or the substrate 71C by the joint fixing portion 177.

In this configuration, when the joint members 161 and 162 are attached to and detached from the other supply side second tube 141 and the discharge side second tube 144, it is possible to suppress the force from being acted on the supply side first tube 142C and the discharge side first tube 143C from the joint members 161 and 162 sides.

As a result, in the server 2C, it is possible to prevent the load from being applied to the connection portion between the supply side first tube 142C, the discharge side first tube 143C, and the cooling member 73C, and the fixing portion of the cooling member 73C on the housing 3C side.

In addition, the joint fixing portion 177 can prevent the joint members 161 and 162 from moving in the vertical direction Dv. As a result, it is possible to prevent the joint members 161 and 162 from interfering with the lower substrate 5, the lid (not shown) that closes the upper portion of the housing 3C, and the like.

In such a server 2C, the plate portion 171 provided on the support member 170 is disposed between the joint members 161 and 162 and the lower substrate 5.

In this configuration, when the joint members 161 and 162 are attached to and detached from the other supply side second tube 141 and the discharge side second tube 144, the plate portion 171 can receive the cooling medium, for example, in a case in which the cooling medium drips.

Therefore, the server 2C can prevent the cooling medium from dripping on the lower substrate 5 disposed below the support member 170.

In such a server 2C, the plate portion 171 includes the recessed portion 171a that is recessed downward.

In this configuration, the recessed portion 171a can receive the cooling medium dripping when the joint members 161 and 162 are attached to and detached from the other supply side second tube 141 and the discharge side second tube 144.

As a result, it is possible to more reliably prevent the cooling medium from dripping from the support member 170 onto the substrate 71C.

In such a server 2C, the support member 170 includes the ventilation portions 175 that allow the cooling air W (wind) from the cooling fan 8 to pass toward the electronic components 77 provided in the housing 3C.

In this configuration, the cooling air W from the cooling fan 8 can be applied to the electronic components 77 provided in the housing 3C through the ventilation portions 175 formed in the support member 170.

As a result, the server 2C can improve the cooling performance for the electronic components 77.

In such a server 2C, the support member 170 includes the guide walls 174 that guide the cooling air W from the cooling fan 8 toward the electronic components 77 provided in the housing 3C.

In this configuration, the guide walls 174 formed on the support member 170 can more efficiently guide the cooling air W from the cooling fan 8 to the electronic components 77 in the housing 3C.

As a result, the server 2C can further improve the cooling performance for the electronic components 77.

Such a server 2C is further provided with the supply side second tube 141 and the discharge side second tube 144 extending in directions different from that of the supply side first tube 142C and the discharge side first tube 143C. The joint members 161 and 162 include the second connection portion 161b and 162b extending in the tube axial directions of the supply side second tube 141 and the discharge side second tube 144 and to which the supply side second tube 141 and the discharge side second tube 144 are connected.

In this configuration, when the supply side second tube 141 and the discharge side second tube 144 are attached to and detached from the second connection portions 161b and 162b provided on the joint members 161 and 162, a force in the attachment and detachment direction of the supply side second tube 141 and the discharge side second tube 144 acts on the supply side first tube 142C and the discharge side first tube 143C from the joint members 161 and 162 sides.

At that time, it is possible to suppress the force in the attachment and detachment direction from being transmitted to one end side of the supply side first tube 142C and the discharge side first tube 143C by the tube fixing portion 178.

Therefore, in the server 2C, it is possible to effectively suppress the force in the attachment and detachment direction from being transmitted to the connection portion between the supply side first tube 142C, the discharge side first tube 143C, and the cooling member 73C, and the fixing portion of the cooling member 73C on the housing 3C side.

In such a server 2C, the supply side first tube 142C, the discharge side first tube 143C, the joint members 161 and 162, the supply side second tube 141, and the discharge side second tube 144 are provided so as to bypass the electronic components 77 mounted on the substrate 71C.

Therefore, with the configuration that bypasses the electronic components 77, the server 2C can prevent the load from being applied to the connection portion between the supply side first tube 142C, the discharge side first tube 143C, and the cooling member 73C, and the fixing portion of the cooling member 73C on the housing 3C side.

Such a server 2C is provided with the downstream side tube 120C and the discharge tube 130C for supplying the cooling medium to the second module 20C provided at a position different from that of the substrate 71C or discharging the cooling medium from the second module 20C. The supply side second tube 141 and the discharge side second tube 144 are connected to the downstream side tube 120C and the discharge tube 130C.

In this configuration, the cooling medium is supplied from the downstream side tube 120C that supplies the cooling medium to the second module 20C to the cooling member 73C through the supply side second tube 141, the joint member 161, and the supply side first tube 142C. In addition, the cooling medium in the cooling member 73C is sent to the discharge tube 130C for discharging the cooling medium from the second module 20C through the discharge side first tube 143C, the joint member 162, and the discharge side second tube 144. As a result, it is not necessary to provide a tube for supplying or discharging the cooling medium only to the cooling member 73C in the housing 3C.

Therefore, with the configuration in which the number of tubes is reduced, the server 2C can prevent the load from being applied to the connection portion between the supply side first tube 142C, the discharge side first tube 143C, and the cooling member 73C, and the fixing portion of the cooling member 73C on the housing 3C side.

Modification Examples of Example Embodiments

In the second example embodiment, the support member 170 is provided with the plate portion 171, the joint fixing portion 177, and the tube fixing portion 178, but the support member 170 needs only to be provided with at least the tube fixing portion 178. In addition to this, the configuration of each portion of the support member 170 can be changed as appropriate.

Furthermore, in the second example embodiment, the side modules 6 are provided in the housing 3C, but the number, arrangement, configuration, and the like of first modules 10C and second modules 20C constituting the side module 6 can be changed as appropriate. In addition, the server 2C may be configured not to be provided with the side module 6.

In addition, the application, component configuration, number of equipment, and the like of the electronic device 2A and the server 2C shown in the first and second example embodiments are not limited at all.

In addition to this, as long as it does not deviate from the gist of the present invention, it is possible to select the configuration described in the above example embodiments or change the configuration to another configuration as appropriate.

This application is based upon and claims the benefit of priority from Japanese Patent Application No. 2019-205335 filed on Nov. 13, 2019, the disclosure of which is incorporated herein in its entirety by reference.

INDUSTRIAL APPLICABILITY

The present invention can be applied to, for example, an electronic device provided with a cooling member for cooling a heat generating member. According to the present invention, it is possible to prevent the load from being applied to the connection portion between the tube and the cooling member and the fixing portion of the cooling member on the housing side.

DESCRIPTION OF REFERENCE SIGNS

2A: Electronic device
2C: Server (electronic device)
3A, 3C: Housing
5: Lower substrate
8: Cooling fan
20C: Second module (electronic component module)
31: First tube
32, 161, 162: Joint member
32a, 161a, 162a: First connection portion
33, 170: Support member
34, 178: Tube fixing portion
71A, 71C: Substrate
72A: Heat generating member
72C: CPU (heat generating member)
73A, 73C: Cooling member
77: Electronic component (component)
120C: Downstream side tube (third tube)
130C: Discharge tube (third tube)
141: Supply side second tube (second tube)
142C: Supply side first tube (first tube)
143C: Discharge side first tube (first tube)
144: Discharge side second tube (second tube)
161b, 162b: Second connection portion
170: Support member
171: Plate portion
171a: Recessed portion
174: Guide wall
175: Ventilation portion
177: Joint fixing portion
W: Cooling air (wind)

What is claimed is:

1. An electronic device comprising:
   a substrate which is provided in a housing and on which a heat generating member is mounted;
   a cooling member configured to cool the heat generating member;
   a first tube including one end connected to the cooling member and configured to supply a cooling medium to the cooling member or discharge the cooling medium from the cooling member;
   a joint member including a first connection portion extending in a tube axial direction of the first tube and connected to another end of the first tube;
   a support member fixed to the housing or the substrate;
   a tube fixing portion configured to fix the first tube to the support member; and
   a lower substrate disposed below the joint member,
   wherein the support member includes a plate potion configured to separate the lower substrate and the joint member.

2. The electronic device according to claim 1, wherein the support member further comprises a joint fixing portion configured to fix the joint member.

3. The electronic device according to claim 1, wherein the plate portion comprises a recessed portion recessed downward.

4. The electronic device according to claim 1, further comprising a cooling fan provided in the housing, wherein the support member further comprises a ventilation portion configured to cause air from the cooling fan to pass toward an electronic component provided in the housing.

5. The electronic device according to claim 4, wherein the support member further comprises a guide wall configured to guide the air from the cooling fan toward the electronic component provided in the housing.

6. The electronic device according to claim 1, further comprising a second tube that extends in a direction different from that of the first tube,
wherein the joint member further comprises a second connection portion extending in a tube axial direction of the second tube and to which the second tube is connected.

7. The electronic device according to claim 6, wherein the first tube, the joint member, and the second tube are provided so as to bypass a component mounted on the substrate.

8. The electronic device according to claim 6, further comprising:
an electronic component module provided at a position different from that of the substrate in the housing; and
a third tube configured to supply the cooling medium to the electronic component module or discharge the cooling medium from the electronic component module,
wherein the second tube is connected to the third tube.

* * * * *